US011469725B2

(12) United States Patent
Cao et al.

(10) Patent No.: US 11,469,725 B2
(45) Date of Patent: Oct. 11, 2022

(54) APPARATUS AND METHODS FOR POWER AMPLIFIER OUTPUT MATCHING

(71) Applicant: Skyworks Solutions, Inc., Irvine, CA (US)

(72) Inventors: Yuan Cao, Milpitas, CA (US); Yu-Jui Lin, Westlake Village, CA (US); Russ Alan Reisner, Oxnard, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/893,133

(22) Filed: Jun. 4, 2020

(65) Prior Publication Data

US 2020/0403586 A1    Dec. 24, 2020

Related U.S. Application Data

(60) Provisional application No. 62/858,857, filed on Jun. 7, 2019.

(51) Int. Cl.
*H03F 3/191* (2006.01)
*H03F 3/24* (2006.01)
(Continued)

(52) U.S. Cl.
CPC ............. *H03F 3/245* (2013.01); *H03F 1/565* (2013.01); *H03F 3/195* (2013.01); *H04B 1/0458* (2013.01);
(Continued)

(58) Field of Classification Search
CPC ...................................................... H03F 3/191
(Continued)

(56) References Cited

U.S. PATENT DOCUMENTS 6,236,274 B1 * 5/2001 Liu .......................... H03F 3/217
330/302
8,098,114 B2 1/2012 Fukuda et al.
(Continued)

FOREIGN PATENT DOCUMENTS

CN    201733278 U    2/2011
CN    107370460 A    11/2017

OTHER PUBLICATIONS

US 10,367,461 B2, 07/2019, Poulin et al. (withdrawn)

*Primary Examiner* — Henry Choe
(74) *Attorney, Agent, or Firm* — Knobbe, Martens, Olson and Bear, LLP

(57) ABSTRACT

Apparatus and methods for power amplifier output matching is disclosed. In one aspect, there is provided an output matching circuit including an input configured to receive an amplified radio frequency signal from a power amplifier, a first output, and a second output. The output matching circuit further includes a first matching circuit electrically connected between the input of the output matching circuit and the first output, the first matching circuit configured to suppress harmonics of a fundamental frequency of the amplified radio frequency signal when the amplified radio frequency signal is within a first band. The output matching circuit further includes a second matching circuit electrically connected between the input of the output matching circuit and the second output, the second matching circuit configured to suppress harmonics of the fundamental frequency of the amplified radio frequency signal when the amplified radio frequency signal is within a second band different from the first band.

20 Claims, 11 Drawing Sheets

(51) Int. Cl.
  *H03F 3/195*     (2006.01)
  *H04B 1/04*      (2006.01)
  *H03F 1/56*      (2006.01)

(52) U.S. Cl.
  CPC .. *H03F 2200/318* (2013.01); *H03F 2200/451* (2013.01)

(58) Field of Classification Search
  USPC ................................................ 330/302, 305
  See application file for complete search history.

(56) References Cited

U.S. PATENT DOCUMENTS

| | | | |
|---|---|---|---|
| 8,154,340 B2 * | 4/2012 | Dupuy | H03F 1/0261 330/126 |
| 8,384,484 B2 * | 2/2013 | Winslow | H03F 1/565 330/302 |
| 8,611,834 B2 | 12/2013 | Harris et al. | |
| 8,717,100 B2 | 5/2014 | Reisner et al. | |
| 8,717,102 B2 * | 5/2014 | Wilson | H03F 1/0288 330/302 |
| 8,736,378 B1 * | 5/2014 | Hau | H03F 3/68 330/302 |
| 9,054,663 B2 | 6/2015 | Reisner et al. | |
| 9,337,784 B2 | 5/2016 | Kim et al. | |
| 9,391,567 B2 | 7/2016 | Kaczman | |
| 9,503,025 B2 | 11/2016 | Cao et al. | |
| 9,602,064 B2 | 3/2017 | Wu et al. | |
| 9,660,606 B2 | 5/2017 | Lyalin et al. | |
| 9,660,688 B2 | 5/2017 | Kaczman | |
| 9,698,740 B2 | 7/2017 | Lin et al. | |
| 9,831,841 B2 | 11/2017 | Wu et al. | |
| 9,859,853 B2 | 1/2018 | Kaczman | |
| 9,882,539 B1 | 1/2018 | Poulin et al. | |
| 10,063,200 B2 | 8/2018 | Wu et al. | |
| 10,135,408 B2 | 11/2018 | Cao et al. | |
| 10,205,490 B2 | 2/2019 | Wloczysiak | |
| 10,263,594 B2 | 4/2019 | Lyalin et al. | |
| 10,418,951 B2 | 9/2019 | Poulin et al. | |
| 11,258,429 B2 | 2/2022 | Ando et al. | |
| 11,283,416 B2 | 3/2022 | Cao et al. | |
| 11,296,664 B2 | 4/2022 | Lee | |
| 11,316,487 B2 | 4/2022 | Andrys et al. | |
| 11,323,073 B2 | 5/2022 | King et al. | |
| 11,329,621 B2 | 5/2022 | Lee et al. | |
| 2001/0022534 A1 * | 9/2001 | Otani | H03F 3/265 330/302 |
| 2007/0236296 A1 * | 10/2007 | Lee | H03F 1/56 330/302 |
| 2012/0154054 A1 | 6/2012 | Kaczman et al. | |
| 2012/0235737 A1 | 9/2012 | Reisner et al. | |
| 2014/0203878 A1 | 7/2014 | Reisner et al. | |
| 2014/0320205 A1 | 10/2014 | Lyalin et al. | |
| 2015/0303971 A1 | 10/2015 | Reisner et al. | |
| 2015/0365057 A1 | 12/2015 | Kaczman | |
| 2015/0381123 A1 | 12/2015 | Wu et al. | |
| 2015/0381126 A1 | 12/2015 | Wu et al. | |
| 2016/0013758 A1 | 1/2016 | Cao et al. | |
| 2016/0013767 A1 | 1/2016 | Lin et al. | |
| 2016/0093578 A1 | 3/2016 | Penunuri et al. | |
| 2016/0164474 A1 | 6/2016 | Lizarraga et al. | |
| 2016/0254838 A1 | 9/2016 | Reisner et al. | |
| 2016/0285425 A1 | 9/2016 | Poulin et al. | |
| 2016/0285499 A1 | 9/2016 | Kaczman | |
| 2016/0285503 A1 | 9/2016 | Poulin et al. | |
| 2017/0040958 A1 | 2/2017 | Cao et al. | |
| 2017/0149390 A1 | 5/2017 | Rogers et al. | |
| 2017/0222605 A1 | 8/2017 | Kaczman | |
| 2017/0302239 A1 | 10/2017 | Wu et al. | |
| 2017/0338847 A1 | 11/2017 | Reisner et al. | |
| 2018/0006626 A1 | 1/2018 | Lyalin et al. | |
| 2018/0175814 A1 | 6/2018 | Wu et al. | |
| 2019/0245508 A1 | 8/2019 | Lyalin et al. | |
| 2020/0021257 A1 | 1/2020 | Poulin et al. | |
| 2020/0052660 A1 | 2/2020 | Cao et al. | |
| 2020/0336122 A1 | 10/2020 | Lin et al. | |
| 2020/0403582 A1 | 12/2020 | Takenaka et al. | |
| 2020/0403586 A1 | 12/2020 | Cao et al. | |
| 2022/0045710 A1 | 2/2022 | Farahvash et al. | |
| 2022/0103136 A1 | 3/2022 | Domino et al. | |
| 2022/0103197 A1 | 3/2022 | Briseno-Vidrios | |

* cited by examiner

APPARATUS AND METHODS FOR POWER AMPLIFIER OUTPUT MATCHING

CROSS REFERENCE TO PRIORITY APPLICATIONS

This application claims the benefit of priority of U.S. Provisional Patent Application No. 62/858,857, filed Jun. 7, 2019 and titled "APPARATUS AND METHODS FOR POWER AMPLIFIER OUTPUT MATCHING," the disclosures of each of which are hereby incorporated by reference in their entireties herein.

BACKGROUND

Field

The systems and methods disclosed herein are directed to electronic systems, and in particular, to radio frequency (RF) electronics.

Description of the Related Technology

RF power amplifiers can be used to boost the power of an RF signal having a relatively low power. Thereafter, the boosted RF signal can be used for a variety of purposes, included driving an antenna of a transmitter.

Power amplifiers can be included in mobile phones to amplify an RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify an RF signal. It can be important manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

An output matching circuit can be included at the output of a power amplifier. The output matching circuit can be used to increase power transfer and/or reduce reflections of the amplified RF signal generated by the power amplifier.

SUMMARY OF CERTAIN INVENTIVE ASPECTS

The systems, methods and devices of this disclosure each have several innovative aspects, no single one of which is solely responsible for the desirable attributes disclosed herein.

In one aspect, there is provided a power amplifier system. The power amplifier system can include a power amplifier that is configured to amplify a radio frequency input signal that has a fundamental frequency. The power amplifier includes an input that is configured to receive the radio frequency input signal and an output that is configured to generate an amplified radio frequency signal. The power amplifier system can also include an output matching circuit that includes an input that is configured to receive the amplified radio frequency signal, a first output, a second output, a first matching circuit that is electrically connected between the input of the output matching circuit and the first output, and a second matching circuit that is electrically connected between the input of the output matching circuit and the second output. The first matching circuit is configured to suppress harmonics of the fundamental frequency of the amplified radio frequency signal when the radio frequency input signal is within a first band. The second matching circuit is configured to suppress harmonics of the fundamental frequency of the amplified radio frequency signal when the radio frequency input signal is within a second band different from the first band.

In certain embodiments, the first matching circuit includes a second-order harmonic resonant circuit that is configured to suppress second-order frequency signal components of the amplified radio frequency signal and a first third-order harmonic resonant circuit that is configured to suppress third-order frequency signal components of the amplified radio frequency signal. The second matching circuit can include a second third-order harmonic resonant circuit that is configured to suppress third-order frequency signal components of the amplified radio frequency signal.

In certain embodiments, the second-order harmonic resonant circuit includes a capacitor and an inductor connected in parallel, and each of the first and second third-order harmonic resonant circuits includes a capacitor and an inductor connected in series to ground.

In certain embodiments, the output matching circuit further includes a balun that is electrically connected between the output of the power amplifier and each of the first matching circuit and the second matching circuit.

In certain embodiments, the output matching circuit further includes a third output and a third matching circuit that are electrically connected between the input of the output matching circuit and the third output. The third matching circuit can be configured to suppress harmonics of the fundamental frequency of the amplified radio frequency signal when the radio frequency input signal is within a third band different from the first and second bands.

In certain embodiments, the power amplifier system further includes an input switch that includes a first input that is configured to receive the radio frequency input signal when the radio frequency input signal is within the first band, a second input that is configured to receive the radio frequency input signal when the radio frequency input signal is within the second band, and an output that is configured to output the radio frequency input signal to the power amplifier.

In certain embodiments, the output matching circuit further includes a first resistor that is electrically connected between the first matching circuit and the first output and configured to match an output impedance of the power amplifier when the radio frequency input signal is within the first band, and a second resistor that is electrically connected between the second matching circuit and the second output and configured to match the output impedance of the power amplifier when the radio frequency input signal is within the second band.

In certain embodiments, the first matching circuit includes a second-order harmonic resonant circuit that is configured to suppress second-order frequency signal components of the amplified radio frequency signal and a first third-order harmonic resonant circuit that is configured to suppress third-order frequency signal components of the amplified radio frequency signal. The second matching circuit can include a second-order harmonic resonant circuit that is configured to suppress second-order frequency signal components of the amplified radio frequency signal and a second third-order harmonic resonant circuit that is configured to suppress third-order frequency signal components of the amplified radio frequency signal.

In another aspect, there is provided an output matching circuit for a power amplifier that amplifies a radio frequency signal that has a fundamental frequency. The output matching circuit can include an input that is configured to receive an amplified radio frequency signal from a power amplifier. The output matching circuit can also include a first output, a second output, a first matching circuit that is electrically connected between the input of the output matching circuit and the first output, and a second matching circuit electrically connected between the input of the output matching circuit and the second output. The first matching circuit is configured to suppress harmonics of a fundamental frequency of the amplified radio frequency signal when the amplified radio frequency signal is within a first band. The second matching circuit is configured to suppress harmonics of the fundamental frequency of the amplified radio frequency signal when the amplified radio frequency signal is within a second band different from the first band.

In certain embodiments, the first matching circuit includes a second-order harmonic resonant circuit that is configured to suppress second-order frequency signal components of the amplified radio frequency signal and a first third-order harmonic resonant circuit that is configured to suppress third-order frequency signal components of the amplified radio frequency signal. The second matching circuit can include a second third-order harmonic resonant circuit that is configured to suppress third-order frequency signal components of the amplified radio frequency signal.

In certain embodiments, the second-order harmonic resonant circuit includes a capacitor and an inductor that is connected in parallel. Each of the first and second third-order harmonic resonant circuits can include a capacitor and an inductor connected in series to ground.

In certain embodiments, the output matching circuit further includes a balun that is electrically connected between the power amplifier and each of the first matching circuit and the second matching circuit.

In certain embodiments, the output matching circuit further includes a third output and a third matching circuit that are electrically connected between the input of the output matching circuit and the third output. The third matching circuit can be configured to suppress harmonics of the fundamental frequency of the amplified radio frequency signal when the radio frequency input signal is within a third band different from the first and second bands.

In certain embodiments, the output matching circuit further includes a first resistor that is electrically connected between the first matching circuit and the first output and configured to match an output impedance of the power amplifier when the radio frequency input signal is within the first band, and a second resistor that is electrically connected between the second matching circuit and the second output and configured to match the output impedance of the power amplifier when the radio frequency input signal is within the second band.

In certain embodiments, the first matching circuit includes a second-order harmonic resonant circuit that is configured to suppress second-order frequency signal components of the amplified radio frequency signal, and a first third-order harmonic resonant circuit that is configured to suppress third-order frequency signal components of the amplified radio frequency signal. The second matching circuit can include a second-order harmonic resonant circuit that is configured to suppress second-order frequency signal components of the amplified radio frequency signal, and a second third-order harmonic resonant circuit that is configured to suppress third-order frequency signal components of the amplified radio frequency signal.

In yet another aspect, there is provided a power amplifier module. The power amplifier module can include an input pin that is configured to receive an amplified radio frequency signal from a power amplifier. The power amplifier module can also include a first output pin, a second output pin, a first matching circuit that is electrically connected between the input pin and the first output pin, and a second matching circuit electrically connected between the input pin and the second output pin. The first matching circuit is configured to suppress harmonics of a fundamental frequency of the amplified radio frequency signal when the amplified radio frequency signal is within a first band. The second matching circuit is configured to suppress harmonics of the fundamental frequency of the amplified radio frequency signal when the amplified radio frequency signal is within a second band different from the first band.

In certain embodiments, the first matching circuit includes a second-order harmonic resonant circuit that is configured to suppress second-order frequency signal components of the amplified radio frequency signal, and a first third-order harmonic resonant circuit that is configured to suppress third-order frequency signal components of the amplified radio frequency signal. The second matching circuit can include a second third-order harmonic resonant circuit that is configured to suppress third-order frequency signal components of the amplified radio frequency signal.

In certain embodiments, the second-order harmonic resonant circuit includes a capacitor and an inductor that are connected in parallel. Each of the first and second third-order harmonic resonant circuits can include a capacitor and an inductor connected in series to ground.

In certain embodiments, the output matching circuit further includes a balun that is electrically connected between the power amplifier and each of the first matching circuit and the second matching circuit.

In certain embodiments, the power amplifier module further includes a third output pin and a third matching circuit that are electrically connected between the input pin and the third output pin. The third matching circuit can be configured to suppress harmonics of the fundamental frequency of the amplified radio frequency signal when the radio frequency input signal is within a third band different from the first and second bands.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The headings provided herein, if any, are for convenience only and do not necessarily affect the scope or meaning of the claimed invention.

Overview of Examples of Power Amplifier Systems

Figure 1:
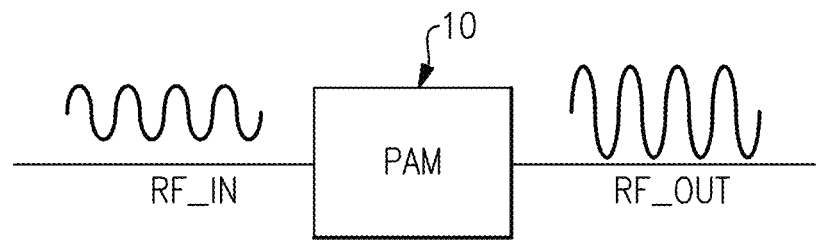
FIG. 1 is a schematic block diagram of a power amplifier module for amplifying a radio frequency (RF) signal.

FIG. 1 is a schematic block diagram of a power amplifier module for amplifying a radio frequency (RF) signal. The illustrated power amplifier module (PAM) 10 can be configured to amplify an RF signal RF_IN (e.g., an RF input signal) to generate an amplified RF signal RF_OUT (e.g., an RF output signal). The RF signal RF_IN can have a fundamental frequency. As described herein, the power amplifier module (PAM) 10 can include one or more power amplifiers.

Figure 2:
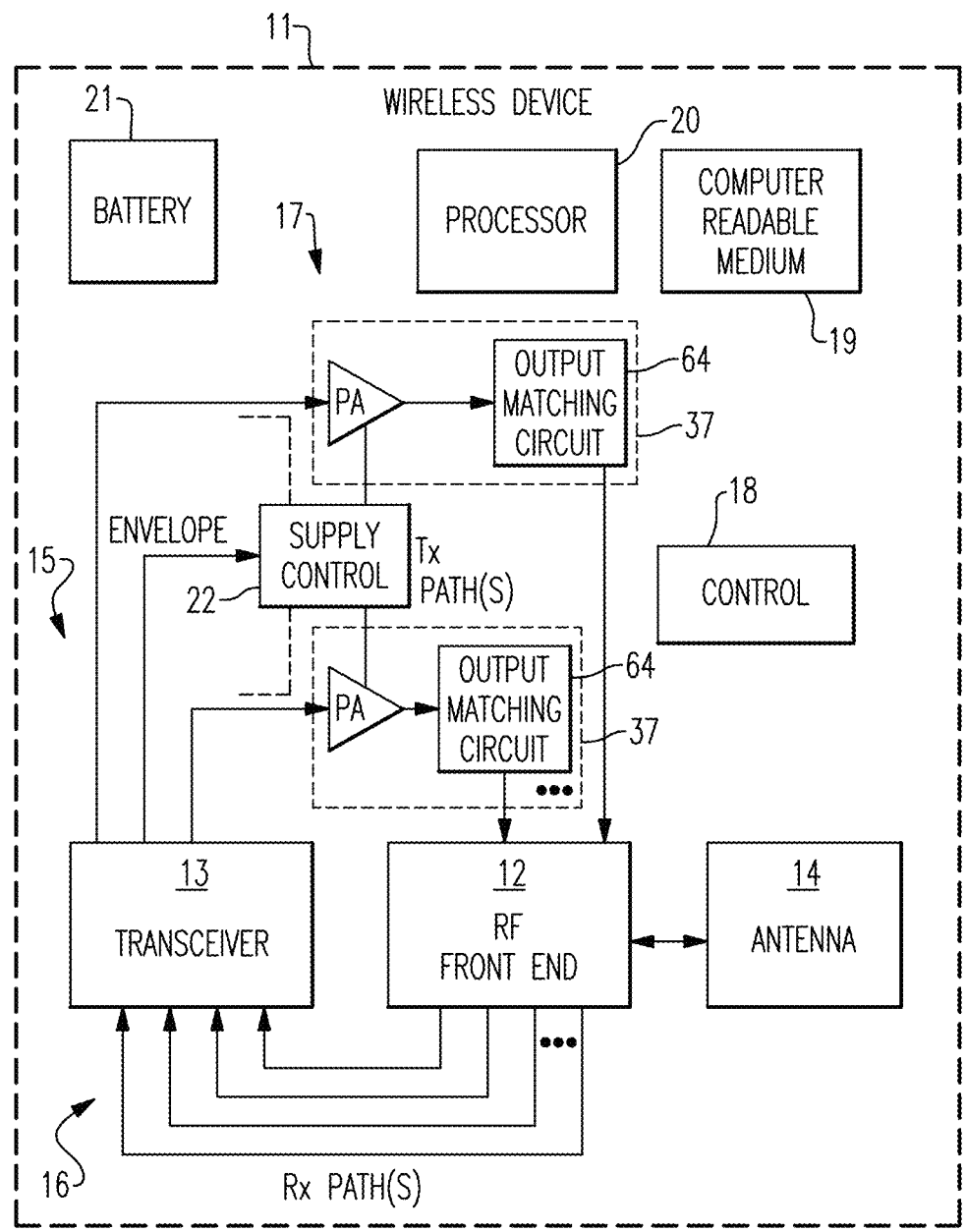
FIG. 2 is a schematic block diagram of an example wireless device that can include one or more of the power amplifier modules of FIG. 1.

FIG. 2 is a schematic block diagram of an example wireless device 11 (e.g., am mobile device) that can include one or more of the power amplifier modules 10 of FIG. 1. The wireless device 11 can include power amplifiers implementing one or more features of the present disclosure.

The example wireless device 11 depicted in FIG. 2 can be a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 or more radio frequency spectrum bands.

One or more features of the present disclosure can be implemented in the foregoing example modes and/or bands, and in other communication standards. For example, 3G, 4G, LTE, advanced LTE, 5G, and 5G NR are non-limiting examples of such standards.

The illustrated wireless device 11 includes an RF front end 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power and high power), and/or amplifications associated with different bands. Each of the power amplifiers 17 may be electrically connected to a corresponding output matching circuit 64 to form a power amplifier block 37. Additional details of the output matching circuit 64 are provided below. Although the configuration illustrated in FIG. 2 includes two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the configuration illustrated in FIG. 2 includes four receiving paths 16, the wireless device 11 can be adapted to include more or fewer receiving paths 16.

To facilitate switching between receive and transmit paths, the RF front end 12 can be configured to electrically connect the antenna 14 to a selected transmit or receive path. Thus, the RF front end 12 can provide a number of switching functionalities associated with an operation of the wireless device 11. In certain embodiments, the RF front end 12 can include a number of switches configured to provide functionalities associated with, for example, switching between different bands, switching between different power modes, switching between transmission and receiving modes, or some combination thereof. The RF front end 12 can also be configured to provide additional functionality, including filtering of signals. For example, the RF front end 12 can include one or more duplexers.

FIG. 2 shows that in certain embodiments, a control component 18 can be provided, and such a component can be configured to provide various control functionalities associated with operations of the RF front end 12, the power amplifiers 17, the supply control block 22, and/or other operating component(s). Non-limiting examples of the control component 18 are described herein in greater detail.

In certain embodiments, a processor 20 can be configured to facilitate implementation of various control processes. In certain configurations, the processor 20 operates using computer program instructions, which can be stored in a computer-readable memory 19.

The illustrated wireless device 11 also includes the supply control block 22, which can be used to provide a power amplifier supply voltage to one or more of the power amplifiers 17. For example, the supply control block 22 can be an envelope tracker configured to control the voltage level of the power amplifier supply voltage based upon an envelope of an RF signal to be amplified by one or more of the power amplifiers. However, in certain embodiments the supply control block 22 can be other blocks, including, for example, a DC-to-DC converter.

The supply control block 22 can be electrically connected to the battery 21, and the supply control block 22 can control the voltage level of the supply voltage provided to the power amplifiers 17 based on an envelope of the RF signal to be amplified. The battery 21 can be any suitable battery for use in the wireless device 11, including, for example, a lithium-ion battery. By controlling the voltage level of the power amplifier supply voltage provided to the power amplifiers, the power consumption of the battery 21 can be reduced, thereby improving performance of the wireless device 11. As illustrated in FIG. 2, the envelope signal can be provided to the supply control block 22 from the transceiver 13. However, the envelope can be determined in other ways. For example, the envelope can be determined by detecting the envelope from the RF signal using any suitable envelope detector.

One technique for reducing power consumption of a power amplifier is envelope tracking, in which the voltage level of the supply voltage of the power amplifier is changed in relation to the envelope of the RF signal. For example, when the envelope of the RF signal increases the voltage level of the power amplifier's power supply can be increased. Likewise, when the envelope of the RF signal decreases the voltage level of the power amplifier's power supply can be decreased to reduce power consumption.

Figure 3:
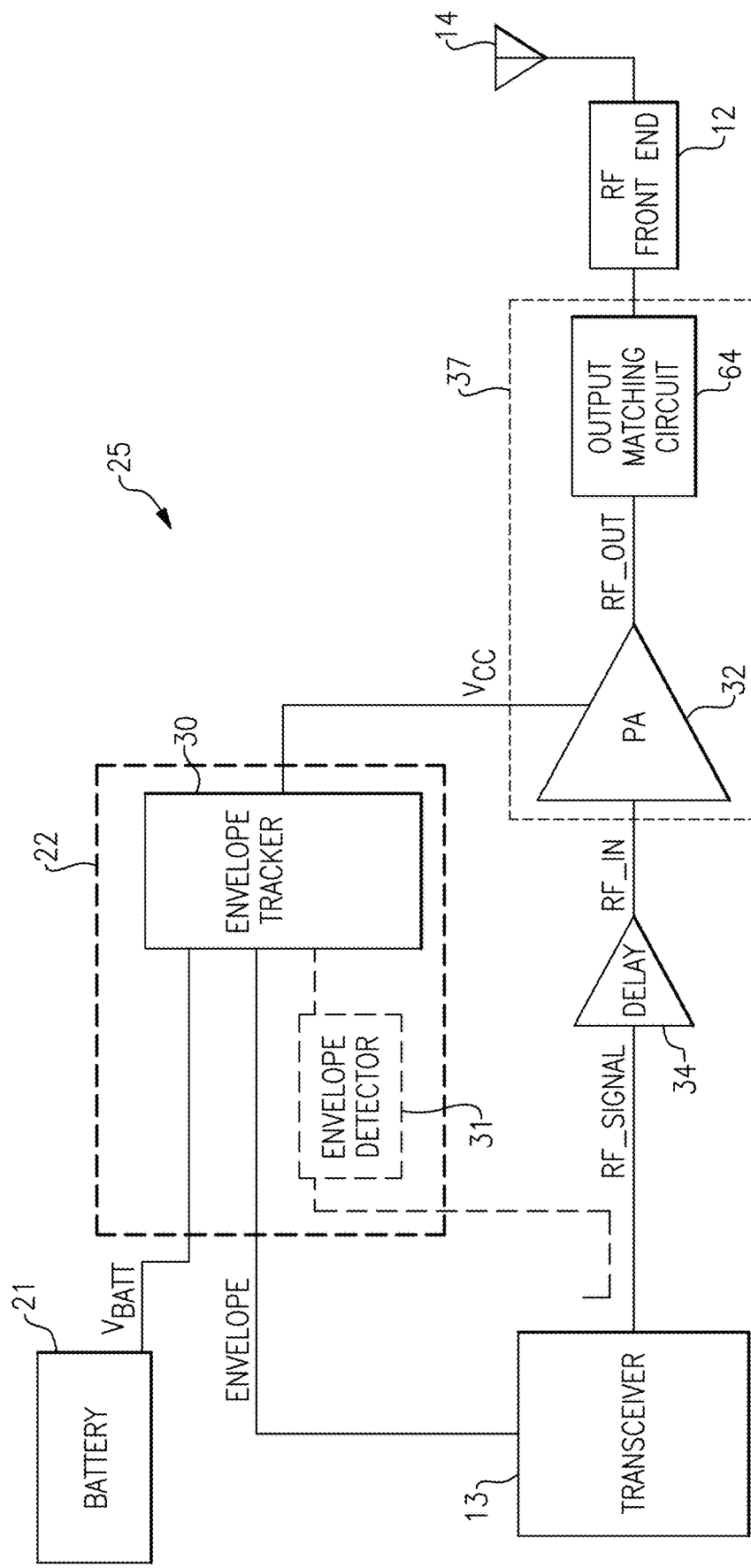
FIG. 3 is a schematic block diagram of one example of a power amplifier system.

FIG. 3 is a schematic block diagram of one example of a power amplifier system 25 including an envelope tracker 30. The illustrated power amplifier system 25 includes the RF front end 12, the transceiver 13, the antenna 14, the battery 21, a delay element 34, a power amplifier block 37 including a power amplifier (PA) 32 and an output matching circuit 64, and a supply control block 22 including the envelope tracker 30. Although the illustrated supply control block 22 includes the envelope tracker 30, other implementations of the supply control block 22 can be used herein that omit the envelope tracker 30.

The transceiver 13 can generate a radio frequency signal RF_SIGNAL, and can provide the signal RF_SIGNAL to a delay element 34. The delay element 34 can delay the signal RF_SIGNAL to generate a signal RF_IN, which can be compensated for a delay in generating a power amplifier supply voltage $V_{CC}$ of the power amplifier 32. The power amplifier 32 can amplify the signal RF_IN to generate the signal RF_OUT, which can be provided to the antenna 14 through the output matching circuit 64 and the RF front end 12. Although FIG. 3 illustrates a configuration using one power amplifier, additional power amplifiers can be electrically connected to the RF front end 12 to aid in providing a desired number of transmit paths. Additionally, although not shown in FIG. 3, the RF front end 12 can be adapted to include one or more receive paths.

The transceiver 13 can also generate the envelope signal ENVELOPE, which can correspond to the envelope of the signal RF_SIGNAL. The envelope tracker 30 is configured to receive a battery voltage $V_{BATT}$ from the battery 21 and the envelope signal ENVELOPE from the transceiver 13. The envelope tracker 30 can generate a power amplifier supply voltage or power high supply voltage $V_{CC}$, which the envelope tracker 30 can control based on the envelope signal ENVELOPE. For example, the envelope tracker 30 can increase a voltage level of the power amplifier supply voltage $V_{CC}$ when the envelope signal ENVELOPE increases, and can decrease a voltage level of the power amplifier supply voltage $V_{CC}$ when the envelope signal ENVELOPE decreases.

Although the transceiver 13 is illustrated as providing the envelope signal ENVELOPE to the envelope tracker 30, the envelope of the signal can be generated in any suitable manner. For example, an envelope detector 31 can be included to generate an envelope signal from the RF signal.

Overview of Examples of Power Amplifier Output Matching Circuits

A power amplifier system using a supply voltage modulation scheme such as envelope tracking or average power tracking (APT) can have improved power performance associated with controlling the power amplifier supply voltage over time. For example, power amplifier systems including supply voltage modulation can exhibit higher power added efficiency (PAE) and/or lower thermal dissipation, which can be important for multi-band/multi-mode wireless device implementations, such as smart phone devices configured to operate using 3G, 4G, and 5G.

Conventional power amplifier output matching circuits may not provide sufficient performance for operation in power amplifier systems employing supply voltage modulation. For example, conventional power amplifier output matching circuits may not be power efficient over a wide range of operating conditions, including at back-off power levels. Moreover, such output matching circuits may not provide harmonic suppression sufficient to maintain stability, harmonic rejection, and/or band-to-band interference rejection of the power amplifier system under varying voltage standing wave ratio (VSWR).

Power amplifier output matching circuits are provided herein. The output matching circuits provide high efficiency at peak saturation for a variety of supply voltage levels, thereby improving performance when used in a power amplifier system that includes a supply control block such as an envelope tracker that changes the power amplifier's supply voltage over time. Additionally, the output matching circuits provide low supply voltage capacitive loading and high efficiency at back-off power levels. The output matching circuits can provide robust harmonic suppression by providing termination at least at second and third harmonic frequencies.

In certain implementations, an output matching circuit includes a supply voltage biasing circuit electrically connected between an input node and a power high supply voltage, a second-order harmonic series resonant circuit electrically connected between the input node and a power low supply voltage, a third-order harmonic parallel resonant circuit electrically connected between the input node and a harmonic frequency grounding node, a third-order harmonic series resonant circuit electrically connected between the harmonic frequency grounding node and the power low supply voltage, and a DC blocking capacitor electrically connected between the harmonic frequency grounding node and an output node.

A power amplifier can drive the input node of the output matching circuit, and the output matching circuit can suppress harmonic frequency signal components of the amplified RF signal generated by the power amplifier. For example, the second-order harmonic series resonant circuit can reduce or eliminate second-order harmonic frequency signal components by providing a low impedance path for second-order harmonic frequency signal components to the power low supply voltage. Additionally, the third-order harmonic series resonant circuit and the third-order harmonic parallel resonant circuit can operate to prevent third-order harmonic frequency signal components from reaching the output node of the output matching circuit. Furthermore, the supply voltage biasing circuit can be used to power the power amplifier driving the input node, and the DC blocking capacitor can provide DC blocking and/or an impedance transformation to help achieve a desired load line impedance of the power amplifier at the fundamental frequency.

Figure 4:
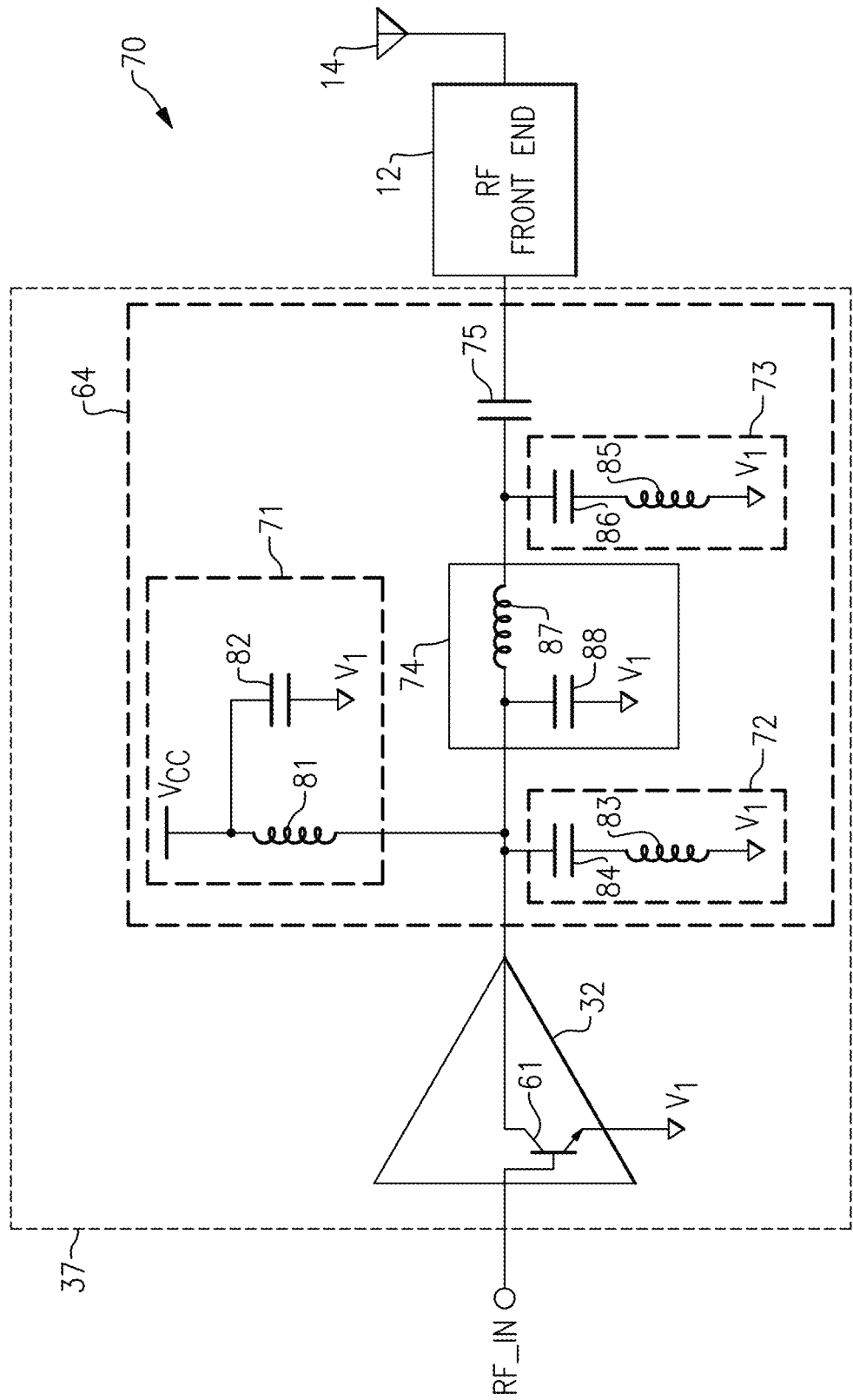
FIG. 4 is an example circuit diagram of a power amplifier system including an output matching circuit in accordance with aspects of this disclosure.

FIG. 4 is an example circuit diagram of a power amplifier system including an output matching circuit in accordance with aspects of this disclosure. In particular, the circuit diagram of FIG. 4 includes a power amplifier system 70 including an output matching circuit 64 according to one embodiment. The power amplifier system 70 includes the RF front end 12, the antenna 14, and the power amplifier block 37 including the power amplifier 32 and the output matching circuit 64. The power amplifier 32 includes an input configured to receive a radio frequency signal RF_IN and an output electrically connected to an input node of the output matching circuit 64. The output matching circuit 64 further includes an output node electrically connected to an input of the RF front end 12. The RF front end 12 includes an output electrically connected to the antenna 14.

The illustrated power amplifier 32 includes a bipolar transistor 61 having an emitter, a base, and a collector. The emitter of the bipolar transistor 61 is electrically connected to a power low supply voltage $V_1$, which can be a ground supply, and the base of the bipolar transistor 61 is configured to receive the signal RF_IN. The bipolar transistor 61 can amplify the signal RF_IN, and provide the amplified signal at the collector, which operates as the output of the power amplifier 32. The bipolar transistor 61 can be any suitable device. In one implementation, the bipolar transistor 61 can be a heterojunction bipolar transistor (HBT).

Although FIG. 4 illustrates one implementation of the power amplifier 32, the teachings described herein can be applied to a variety of power amplifier structures, including, for example, multi-stage power amplifier structures and/or power amplifiers employing other transistor types, including, for example, field-effect transistors.

The output matching circuit 64 includes a supply voltage biasing circuit 71, a second-order harmonic series resonant circuit 72, a third-order harmonic series resonant circuit 73, a third-order harmonic parallel resonant circuit 74, and a DC blocking capacitor 75. The supply voltage biasing circuit 71 is electrically connected between the power high supply voltage $V_{CC}$ and the input node, and the second-order harmonic series resonant circuit 72 is electrically connected between the input node and the power low supply voltage $V_1$. The third-order harmonic parallel resonant circuit 74 is electrically connected between the input node and a harmonic frequency grounding node, and the third-order harmonic series resonant circuit 73 is electrically connected between the harmonic frequency grounding node and the power low supply voltage $V_1$. Additionally, the DC blocking capacitor 75 is electrically connected between the harmonic frequency grounding node and the output node of the output matching circuit 64.

The supply voltage biasing circuit 71 can be used to bias the power amplifier 32 with the power high supply voltage $V_{CC}$, which in certain implementations is generated by an envelope tracker or other supply control block (see FIG. 3). The supply voltage biasing circuit 71 includes a first inductor 81 and a first capacitor 82. The first or choke inductor 81 includes a first end electrically connected to the power high supply voltage $V_{CC}$ and a second end electrically connected to the collector of the bipolar transistor 61 at the output of the power amplifier 32. The choke inductor 81 can have an inductance sufficient to block RF signals generated by the power amplifier 32 from reaching the power high supply voltage $V_{CC}$. However, the choke inductor 81 should be sized to minimize L*dI/dt effects associated with receiver band noise, which can degrade performance in envelope tracking applications. The first or decoupling capacitor 82 includes a first end electrically connected to the power high supply voltage $V_{CC}$ and a second end electrically connected to the power low supply voltage $V_1$, and can perform a wide variety of functions. For example, including the decoupling capacitor 82 can reduce noise of the power high supply voltage $V_{CC}$ and/or stabilize the output of the power amplifier 32. Additionally, the decoupling capacitor 82 can be used to provide an RF/AC ground to the second end of the choke inductor 81.

The second-order harmonic series resonant circuit 72 can be configured to resonate at about two times the fundamental frequency of the signal RF_IN so as to short second-order harmonic frequency signal components in the power amplifier's output signal. In the illustrated configuration, the second-order harmonic series resonant circuit 72 includes a second inductor 83 and a second capacitor 84 electrically connected in series between the power low supply voltage $V_1$ and the collector of the bipolar transistor 61. Although the second-order harmonic series resonant circuit 72 illustrates one configuration of the second-order harmonic series resonant circuit, other configurations can be used, including, for example, implementations in which the order of the second inductor 83 and the second capacitor 84 in the series is reversed.

In one embodiment, the second inductor 83 and the second capacitor 84 can be configured to resonate such that the impedance of the second-order harmonic series resonant circuit 72 at two times the fundamental frequency of the signal RF_IN is less than about 0.7Ω. In another embodiment, the second inductor 83 and the second capacitor 84 can be configured to resonate such that the impedance of the second-order harmonic series resonant circuit 72 at two times the fundamental frequency of the signal RF_IN is less than about 25% of a load line impedance of the output matching circuit 64.

The third-order harmonic series resonant circuit 73 can be configured to resonate at about three times the fundamental frequency of the signal RF_IN so as to provide a low impedance path between the harmonic frequency grounding node and the power low supply voltage $V_1$ at about three times the fundamental frequency. For example, the third-order harmonic series resonant circuit 73 can be used to provide RF ground at the harmonic frequency grounding node for signals having a frequency of about three times the fundamental frequency. In the illustrated configuration, the third-order harmonic series resonant circuit 73 includes a third inductor 85 and a third capacitor 86 electrically connected in series between the power low supply voltage $V_1$ and the harmonic frequency grounding node. Although the third-order harmonic series resonant circuit 73 illustrates one configuration of the third-order harmonic series resonant circuit, other configurations can be used, including, for example, implementations in which the order of the third inductor 85 and the third capacitor 86 are reversed in the series.

In one embodiment, the third inductor 85 and the third capacitor 86 are configured to resonate such that the impedance of the third-order harmonic series resonant circuit 73 at three times the fundamental frequency of the signal RF_IN is less than about 0.7Ω.

The third-order harmonic parallel resonant circuit 74 includes a fourth inductor 87 and a fourth capacitor 88, which can be configured to resonate at about three times the fundamental frequency of the signal RF_IN. The fourth inductor 87 is electrically connected between the collector of the bipolar transistor 61 and the harmonic frequency grounding node, and the fourth capacitor 88 is electrically connected between the collector of the bipolar transistor 61 and the power low supply voltage $V_1$.

The harmonic frequency grounding node can operate as an RF ground for signals at about three times the fundamental frequency of the signal RF_IN. Accordingly, the fourth inductor 87 and the fourth capacitor 88 can be electrically connected in parallel between the output of the power amplifier 32 and RF ground for signal components that are at about three times the fundamental frequency. Thus, the third-order harmonic parallel resonant circuit 74 can be used to block third-order harmonic frequency components generated by the output signal of the power amplifier 32 from reaching the output node of the output matching circuit 64.

The third-order harmonic parallel resonant circuit 74 can improve the third-order harmonic rejection of the power amplifier 32 by providing high impedance to signals at about three times the fundamental frequency of the signal RF_IN. Additionally, the capacitor 88 of the third-order harmonic parallel resonant circuit 74 can improve the performance of the power amplifier system 70 when a supply control block such as an envelope tracker is used to generate the power high supply voltage $V_{CC}$. For example, since the collector-emitter junction capacitance of the bipolar transistor 61 can change with biasing conditions, the capacitor 88 can help reduce variation in the capacitance between the collector of the bipolar transistor 61 and the power low supply voltage $V_1$ for voltage changes in the power high supply voltage $V_{CC}$. Thus, the illustrated output matching circuit 64 can improve overall performance of the power amplifier system 70 in implementations in which the power high supply voltage $V_{CC}$ is generated using an envelope tracker that changes the voltage level of the power high supply voltage $V_{CC}$ over time in relation to the envelope of the signal RF_IN.

In one embodiment, the fourth inductor 87 and the fourth capacitor 88 are configured to resonate such that the impedance of the third-order harmonic parallel resonant circuit 74 at three times the fundamental frequency of the signal RF_IN is greater than about 10Ω. In another embodiment, the fourth inductor 87 and the fourth capacitor 88 are configured to resonate such that the impedance of the third-order harmonic parallel resonant circuit 74 at three times the fundamental frequency of the signal RF_IN is greater than about three times a load line impedance of the output matching circuit 64.

The output matching circuit 64 further includes the DC blocking capacitor 75, which is electrically connected between the harmonic frequency grounding node and the output node of the output matching circuit 64. The DC blocking capacitor 75 can provide DC blocking and/or help provide an impedance transformation to achieve a desired load line impedance of the power amplifier 32 at the fundamental frequency. For example, in certain implementations the DC blocking capacitor 75 can be used at least in part to transform a termination impedance associated with the RF front end 12, such as a 50Ω termination impedance, to a load line impedance that is desirable for the power amplifier 32 from a power efficiency standpoint. Additionally, the DC blocking capacitor 75 can block DC signals, thereby helping to provide DC bias voltage isolation between the output of the power amplifier 32 and the input of the RF front end 12. Although FIG. 4 illustrates a configuration including the DC blocking capacitor 75, in certain implementations the DC blocking capacitor 75 can be omitted, such as in implementations using a surface acoustic wave (SAW) filter.

Although the output matching circuit 64 has been illustrated in the context of one example of a power amplifier system, the output matching circuit 64 can be used in other configurations of power amplifier systems.

Examples of Power Amplifier Output Matching Circuits for Wide Band Systems

Figure 5:
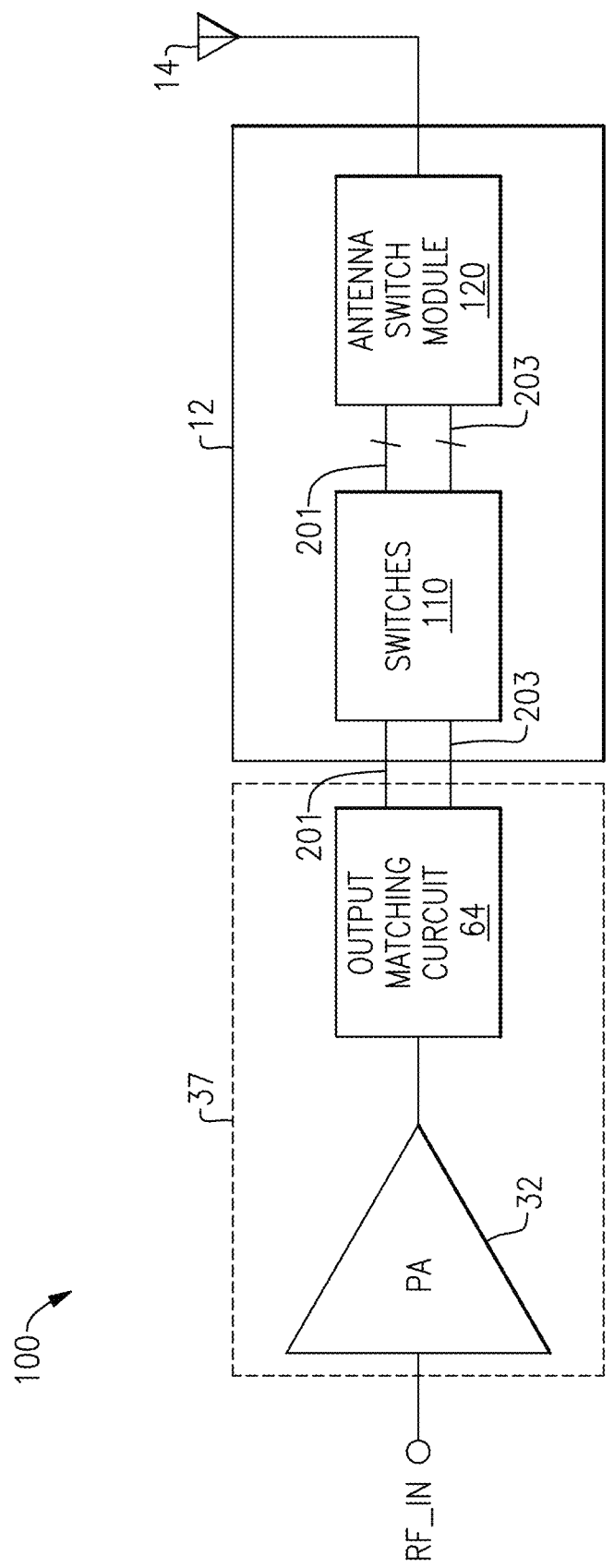
FIG. 5 is a block diagram of another example of a power amplifier system in accordance with aspects of this disclosure.

FIG. 5 is a block diagram of another example of a power amplifier system in accordance with aspects of this disclosure. In particular, the circuit diagram of FIG. 5 includes a power amplifier system 100 including an output matching circuit 64 according to one embodiment. The power amplifier system 100 includes the RF front end 12, the antenna 14, and power amplifier block 37 including the power amplifier 32 and the output matching circuit 64. The power amplifier 32 includes an input configured to receive a radio frequency signal RF_IN and an output electrically connected to an input node of the output matching circuit 64. The output matching circuit 64 further includes two output nodes electrically connected to two inputs of the RF front end 12. The RF front end 12 includes an output electrically connected to the antenna 14.

In the embodiment of FIG. 5, the power amplifier system 100 is configured to operate over a wide band of frequencies. Accordingly, the two output nodes of the output matching circuit 64 may be configured to handle different frequency bands based on the frequency of the radio frequency signal RF_IN. For example, the output matching circuit 64 may be configured to output signals in a first band (e.g., a low band) along a first path 201 and output signals in a second band (e.g., a very low band) along second path 203.

Figure 6:
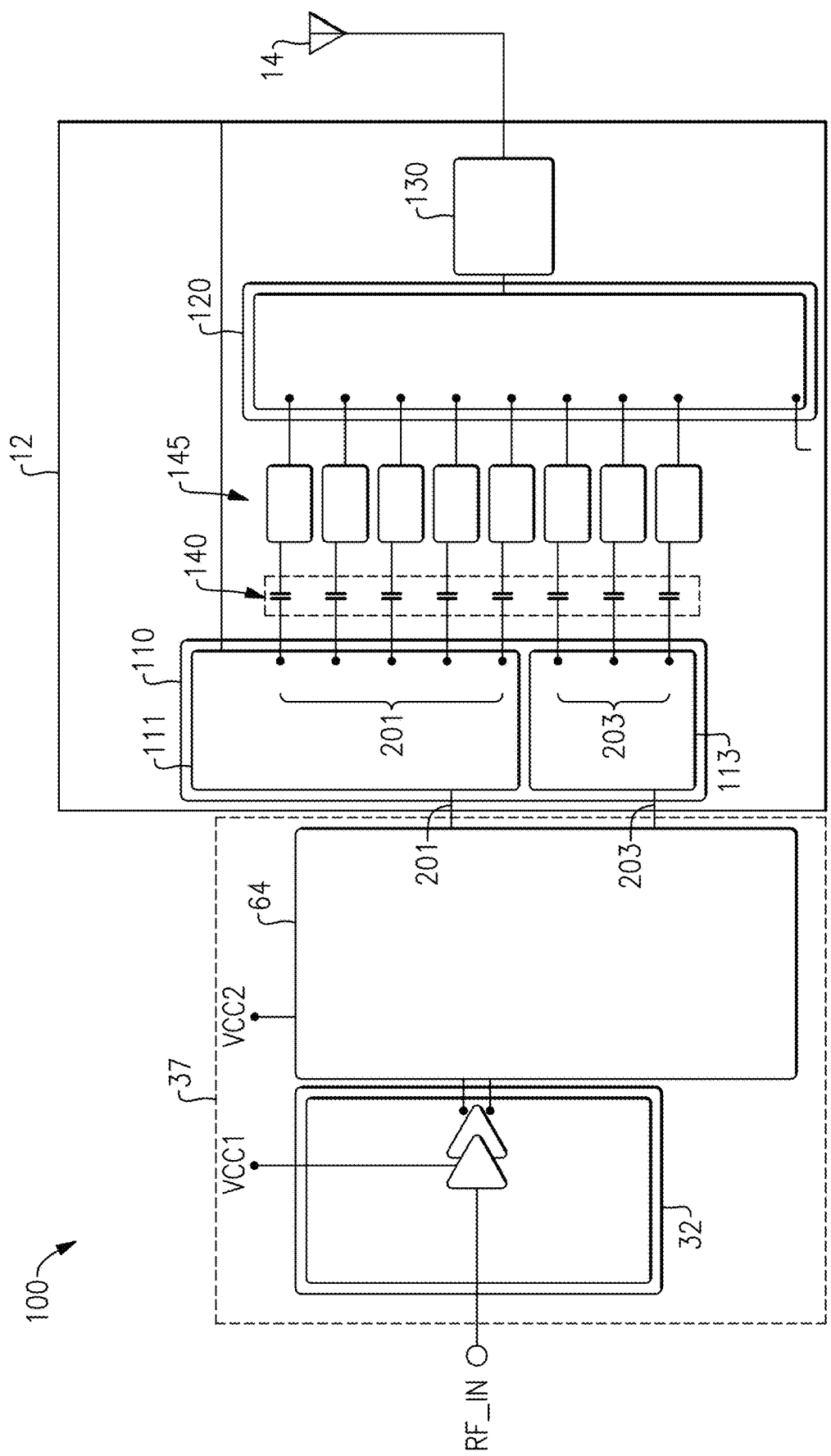
FIG. 6 is a block diagram of the power amplifier system of FIG. 5 illustrated with additional detail.

The RF front end 12 may further include a plurality of switches 110 and an antenna switch module 120. The switches 110 may be configured to connected each of the inputs on the first path 201 and the second path 203 to one of a plurality of outputs on each of the first path 201 and the second path 203. For example, each of the plurality of lines on the first path 201 and the second path 203 between the switches 110 and the antenna switch module 120 may include a filter 145 for a corresponding frequency band as shown in FIG. 6. The antenna switch module may be configured to select one of the lines from among the first path 201 and the second path 203 to be connected to the antenna 14. In some embodiments, the antenna switch module 120 may be implemented as a single pole nine throw switch.

FIG. 6 is a block diagram of the power amplifier system of FIG. 5 illustrated with additional detail. As shown in FIG. 6, the power amplifier system 100 includes the RF front end 12, the antenna 14, and the power amplifier block 37 including the power amplifier 32 and the output matching circuit 64. The RF front end further includes plurality of switches 110, the antenna switch module 120, a filter 130, a plurality of optional capacitors 140, and a plurality of filters 145. The capacitors 140 may be used to improve the output matching capabilities of the output matching network on a band-by-band basis; however, the capacitors 140 may reduce the harmonic suppression of the output matching circuit 64. Thus, in some embodiments, the capacitors 64 are not included in the power amplifier system 100.

As previously mentioned, aspects of this disclosure relate to a power amplifier system 100 configured to operate over a wide bandwidth. For example, the power amplifier system 100 may be configured to overate over a bandwidth having fundamental frequencies that range from about 50 MHz to 100 MHz. In one embodiment, the power amplifier system 100 can operate to receive a signal RF_IN at one of two fundamental frequencies, for example, at fundamental frequencies of about 63 MHz and about 93 MHz. In certain embodiments, each of the first and second bands may be able to handle a bandwidth of about 100 MHz. When the power amplifier system 100 is configured to receive and amplify signal over such a wide bandwidth, the harmonic resonant circuits of the output matching circuit 64 may only be able to short signals having specific frequencies, thereby only removing these specific frequencies from the signals provided to the antenna 14. However, when operating over a wide bandwidth, these specific frequencies shorted by harmonic series resonate circuits (e.g., the harmonic series resonant circuits 72, 73 shown in FIG. 4) may not match the desired frequency components to be removed from the signal RF_IN for all fundamental frequencies of the signal RF_IN.

Accordingly, in some embodiments, the output matching circuit 100 may include two output paths 201 and 203, each of which may be configured to transmit different frequencies of the amplified signal received from the power amplifier 32. Thus, in some embodiments, the output matching circuit 100 may include at least two circuits configured to short certain harmonics of the fundaments frequency of the signal RF_IN, depending on the fundamental frequency used for the signal RF_IN.

The switches 111 can be configured to receive the output from the output matching circuit 64 and transmit the received signal to one of a plurality of lines along the two output paths 201 and 203. Each line may include a DC blocking capacitor 140 and a filter 145 configured to filter certain frequencies corresponding to the selected line. The antenna switch module 120 can be configured to connect the selected line to a final filter block 130 before the signal is provided to the antenna 14.

Figure 7A:
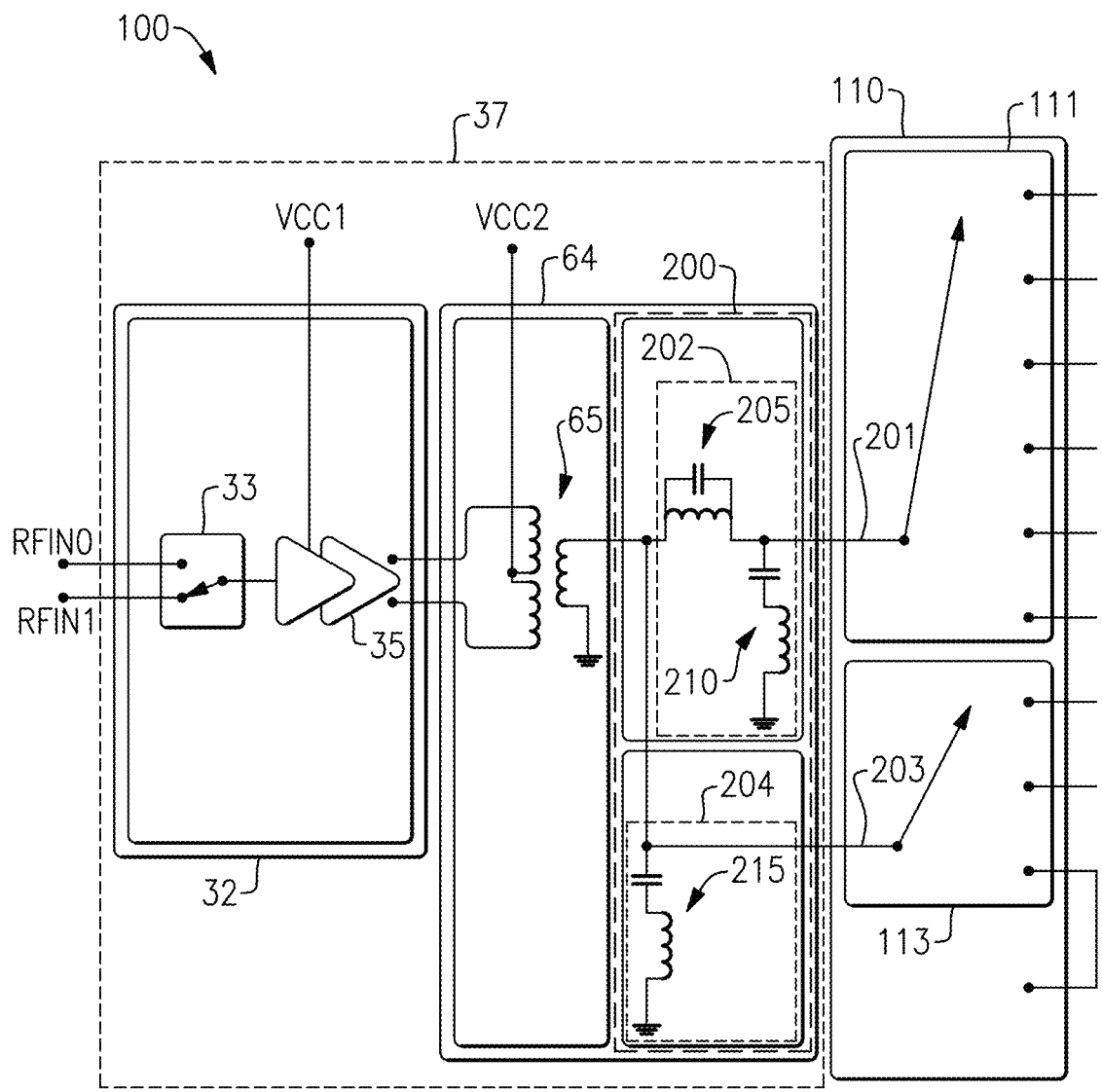
FIG. 7A is a block diagram of a portion of the power amplifier system of FIG. 6 showing certain blocks with additional detail.

FIG. 7A is a block diagram of a portion of the power amplifier system of FIG. 6 showing certain blocks with additional detail. In particular, the portion of the power amplifier system 100 illustrated in FIG. 7A includes the power amplifier block 37 including the power amplifier 32 the output matching circuit 64, and the plurality of switches 110.

The power amplifier block 32 may include one or more power amplifiers 35 and a signal receive switch 33 configured to select one of two input lines as an input to the power amplifiers 35. For example, the signal receive switch 33 may be configured to receive a first signal RFIN0 and a second signal RFIN1. In some embodiments, the first signal RFIN0 may correspond to an RF signal having a low band fundamental frequency (e.g., a fundamental frequency of about 93 MHz) and the second signal RFIN1 may correspond to an RF signal having a very low band fundamental frequency (e.g., a fundamental frequency of about 63 MHz). The power amplifiers 35 may be configured to receive a power amplifier supply voltage VCC1 and amplify the signal received from the signal receive switch 33.

The output matching circuit 64 can include a transformer 65 and a harmonic resonant circuit 200. In some embodiments, the transformer 65 may be implemented as a balun, for example, configured to convert a balanced signal into an unbalanced signal. The balun may be designed based on the power requirements of the power amplifier system 100. The harmonic resonant circuit 200 can be configured to receive the output from the transformer 65 and short certain frequencies from the received signal to ground. The harmonic resonant circuit 200 can include two output paths 201 and 203. In some embodiments, the first output path 201 may be configured to output the first signal RFIN0 (e.g., a low band signal) while the second output path 203 may be configured to output the second signal RFIN1 (e.g., a very low band signal).

The harmonic resonant circuit 200 can be configured to suppress harmonic frequency signal components of the amplified RF signal generated by the power amplifier. Since the power amplifier system 100 is configured to operate over a wide bandwidth such that the power amplifier block 32 can receive a first signal RFIN0 having a first fundamental frequency (e.g., a low band frequency) and a second signal RFIN1 having a second fundamental frequency (e.g., a very low band frequency). In order to accept signals at these two separate fundamental frequencies, the harmonic resonant circuit 200 may include a first matching circuit 202 and a second matching circuit 204 to cover the frequencies of the first and second signals RFIN0 and RFIN1. For example, the first matching circuit 202 may be configured to match the output of the power amplifier 35 and reject harmonic frequencies over the bandwidth of a first band (e.g., a low band) and the second matching circuit 204 may be configured to match the output of the power amplifier 35 and reject harmonic frequencies over the bandwidth of a second band (e.g., a very low band).

The first matching circuit 202 includes a second-order harmonic resonant circuit 205 and a third-order harmonic resonant circuit 210 on the first output path 201. The second-order harmonic resonant circuit 205 can reduce or eliminate second-order harmonic frequency signal components of the first signal RFIN0 by presenting an impedance to the second-order harmonic frequency of the first signal RFIN0. The third-order harmonic resonant circuit 210 can reduce or eliminate third-order harmonic frequency signal components of the first signal RFIN0 by providing a low impedance path for third-order harmonic frequency signal components to ground.

The second matching circuit 204 includes a third-order harmonic resonant circuit 215 on the second output path 203. The third-order harmonic resonant circuit 210 can reduce or eliminate third-order harmonic frequency signal components of the second signal RFIN1 by providing a low impedance path for third-order harmonic frequency signal components to ground.

The plurality of switches 110 can include a first switch 111 formed on the first output path 201 and a second switch 113 formed on the second output path 113. In some embodiments, each of the first switch 111 may be implemented as a single pole six throw switch configured to be connect to six output lines on the first output path 201. Similarly, the second switch 113 may be implemented as a single pole three throw switch configured to be connected to three output lines on the second output path 203. However, the number of lines on each of the output paths 201 and 203 and the particular configuration of the first and second switches 111 and 113 may vary depending on the embodiment. In some embodiments, only one of the first and second switches 111 and 113 is connected to one of the output lines at a time. Each of the output lines may correspond to a predefined band of frequencies within either the first band or the second band.

Figure 7B:
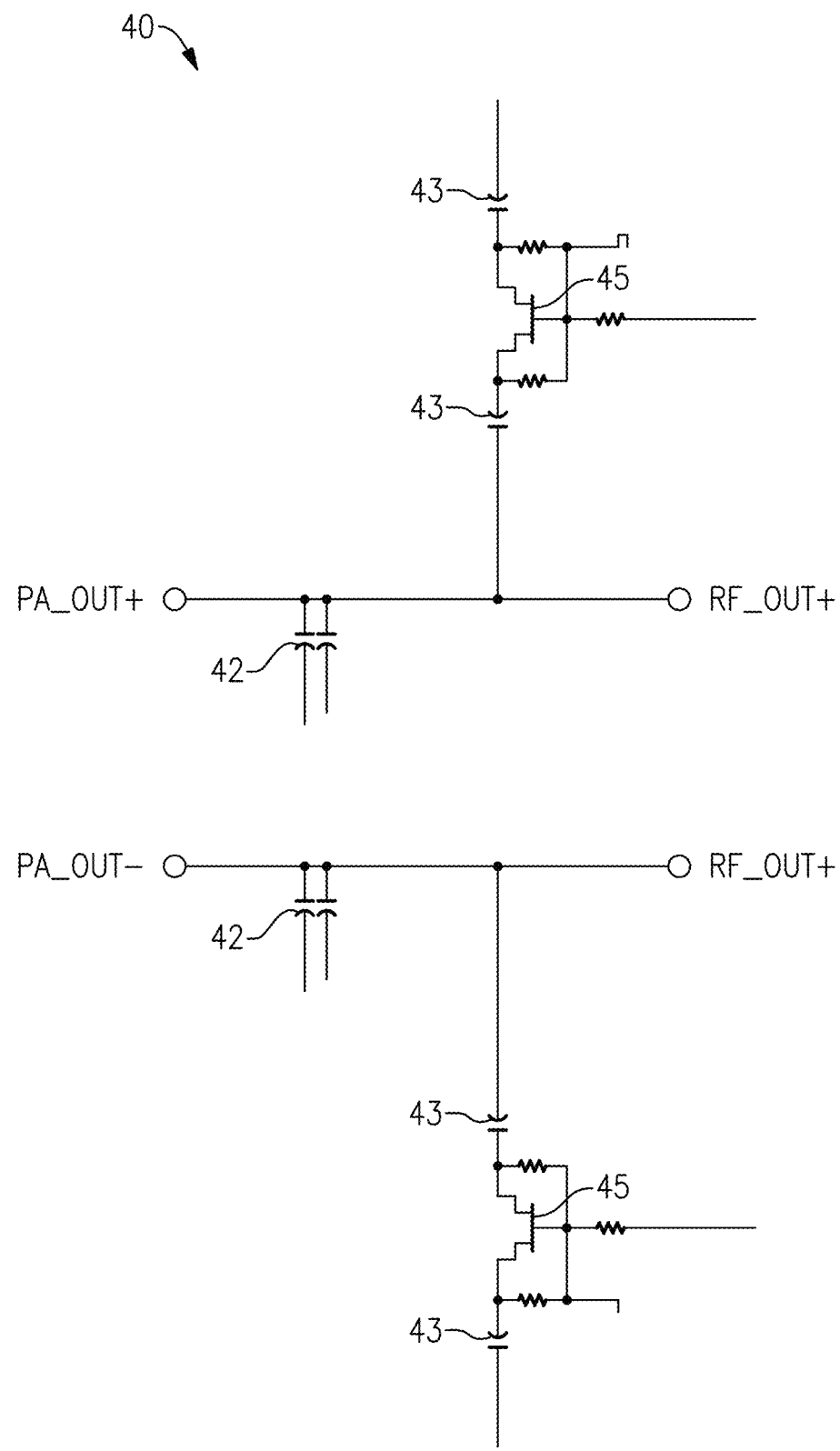
FIG. 7B is circuit diagram illustrating an example output matching circuit included in a power amplifier in accordance with aspects of this disclosure.

The output impedance of the power amplifier 35 may depend on the particular band selected. Due to the wide bandwidth of the power amplifier system 100, it may not be possible to efficiently match the output of the power amplifier 35 over the entire bandwidth. Thus, in some embodiments, the power amplifier block 32 may further include an output matching circuit configured to match the impedance of the power amplifier block 32 based on whether the selected band is in the first band (e.g., the low band) or the second band (e.g., the very low band). FIG. 7B is circuit diagram illustrating an example output matching circuit included in a power amplifier in accordance with aspects of this disclosure.

As shown in FIG. 7B, the output matching circuit 40 includes two inputs PA_OUT+ and PA_OUT− configured to receive the positive and negative balance outputs from the power amplifier 35, two sets of first band capacitors 42, two sets of second band capacitors 43, and two switches 45. In some embodiments, each of the switches 45 may be implemented by a transistor and a plurality of resistors. However, this disclosure is not limited thereto and the switches 45 can be implemented in other ways such that the function to connect the second band capacitors 43 to the first band capacitors 42.

The first band capacitors 42 may be configured to substantially match the output of the power amplifier 35 over the bandwidth of the first band. When the switches 45 are turned on, the second band capacitors 43 may be connected to the first band capacitors to substantially match the output of the power amplifier 35 over the bandwidth of the second band. Thus, the switches 45 can be used to increase the efficiency of the output matching circuit 40 to match the output impedance of the power amplifier 35. In one embodiment, each of the first capacitors 42 has a value of about 3.8 pF and each of the second capacitors 43 have a value of about 5.6 pF. However, the values of the first and second capacitors 42 and 43 can be adjusted based on the output impedance of the power amplifier 35 over the first and second bands.

Although FIG. 7B illustrates one embodiment which can be used for matching the output impedance of the power amplifier 35, aspects of this disclosure also relate to output matching circuits 64 that do not include the use of a switch. In certain embodiments, these nonswitchable output matching circuits may take up less space than a corresponding switched output matching network, which also having flatter response curves. For example, embodiments having switchless output matching networks, (such as those illustrated in FIGS. 8-11) may have a flatter gain, current, PAE, and power variations with respect to changes in frequency when compared to the switched output matching network of FIG. 7B. In addition, the switchless output matching networks may also introduce less noise into the amplified signal, thereby improving the bandwidth efficiency of the power amplifier system 100.

Figure 8:
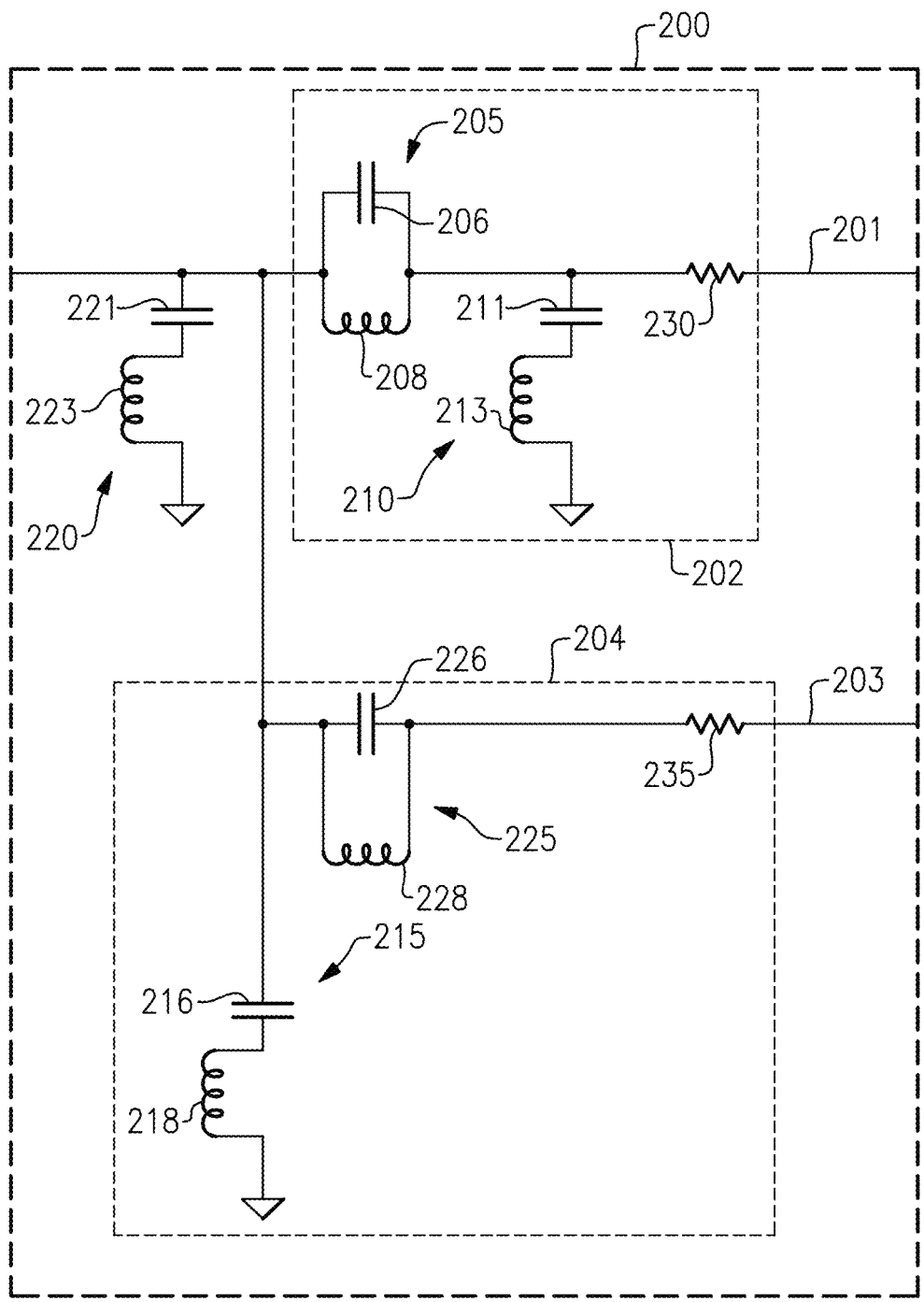
FIG. 8 is a circuit diagram illustrating an example harmonic resonant circuit of an output matching circuit in accordance with aspects of this disclosure.

FIG. 8 is a circuit diagram illustrating an example harmonic resonant circuit of an output matching circuit in accordance with aspects of this disclosure. As shown in FIG. 8, the harmonic resonant circuit 200 includes the first path 201, the second path 203, the first matching circuit 202, the second matching circuit 204, and a resonant circuit 220. The first matching circuit 202 can suppress harmonics of the first signal RFIN0 transmitted along the first path 201, the second matching circuit 204 can suppress harmonics of the second signal RFIN1 transmitted along the second path 203 and the resonant circuit 220 can suppress certain frequencies of signals common to both the first and second signal RFIN0 and RFIN1.

The resonant circuit 220 can be connected between the transformer 65 (e.g., see FIG. 7A) and each of the first matching circuit 202 and the second matching circuit 204. The first matching circuit 202 can be connected between the resonant circuit 220 and the output on the first path 201. The second matching circuit 204 can be connected between the resonant circuit 220 and the output on the second path 203. The resonant circuit 220 can include a capacitor 221 and an inductor 223 connected in series between the input of the harmonic resonant circuit 200 and ground. The resonant circuit 200 can reduce or eliminate resonant frequency signal components of either the first signal RFIN0 or the second signal RFIN1 by providing a low impedance path for the resonant frequency signal components to ground.

Similar to the FIG. 7A embodiment, in FIG. 8 the first matching circuit 202 includes a second-order harmonic resonant circuit 205 and a third-order harmonic resonant circuit 210 on the first output path 201. The second-order harmonic resonant circuit 205 can reduce or eliminate second-order harmonic frequency signal components of the first signal RFIN0 by presenting an impedance to the second-order harmonic frequency of the first signal RFIN0. The third-order harmonic resonant circuit 210 can reduce or eliminate third-order harmonic frequency signal components of the first signal RFIN0 by providing a low impedance path for third-order harmonic frequency signal components to ground.

The second-order harmonic resonant circuit 205 is connected in series between the resonant circuit 220 and the third-order harmonic resonant circuit 210. However, in other embodiments, the location of the second-order harmonic resonant circuit 205 and the third-order harmonic resonant circuit 210 can be reversed. The second-order harmonic resonant circuit 205 can include a capacitor 206 and an inductor 208 connected in parallel. The second-order harmonic resonant circuit 205 can reduce or eliminate second-order harmonic frequency signal components of the first signal RFIN0 by presenting an impedance to the second-order harmonic frequency of the first signal RFIN0. The particular frequency suppressed by the second-order harmonic resonant circuit 205 can be based on a resonant frequency of the second-order harmonic resonant circuit 205, which may depend on the values of the capacitor 206 and the inductor 208.

The third-order harmonic resonant circuit 210 is connected in series between the second-order harmonic resonant circuit 205 and a resistor 230. The resistor 230 may be selected to match the output impedance of the power amplifier block 32 in the first band. The third-order harmonic resonant circuit 210 can include a capacitor 211 and an inductor 213 connected in series between the second-order harmonic resonant circuit 205 and ground. The third-order harmonic resonant circuit 210 can reduce or eliminate third-order harmonic frequency signal components of the first signal RFIN0 by providing a low impedance path for third-order harmonic frequency signal components to ground. The particular frequency suppressed by the third-order harmonic resonant circuit 210 can be based on a resonant frequency of the third-order harmonic resonant circuit 210, which may depend on the values of the capacitor 211 and the inductor 213.

The second matching circuit 204 includes a second-order harmonic resonant circuit 225 and a third-order harmonic resonant circuit 215 on the second output path 203. The third-order harmonic resonant circuit 215 is connected in series between the resonant circuit 220 and the second-order harmonic resonant circuit 225. However, in other embodiments, the location of the second-order harmonic resonant circuit 225 and the third-order harmonic resonant circuit 215 can be reversed.

The second-order harmonic resonant circuit 225 is connected in series between the third-order harmonic resonant circuit 215 and a resistor 235. The resistor 235 may be selected to match the output impedance of the power amplifier block 32 in the second band. The second-order harmonic resonant circuit 225 can include a capacitor 226 and an inductor 228 connected in parallel. The second-order harmonic resonant circuit 225 can reduce or eliminate second-order harmonic frequency signal components of the second signal RFIN1 by presenting an impedance to the second-order harmonic frequency of the first signal RFIN1. The particular frequency suppressed by the second-order harmonic resonant circuit 225 can be based on a resonant frequency of the second-order harmonic resonant circuit 225, which may depend on the values of the capacitor 226 and the inductor 228.

The third-order harmonic resonant circuit 215 can include a capacitor 216 and an inductor 218 connected in series between the output of the resonant circuit 220 and ground. The third-order harmonic resonant circuit 215 can reduce or eliminate third-order harmonic frequency signal components of the second signal RFIN1 by providing a low impedance path for third-order harmonic frequency signal components to ground. The particular frequency suppressed by the third-order harmonic resonant circuit 215 can be based on a resonant frequency of the third-order harmonic resonant circuit 215, which may depend on the values of the capacitor 216 and the inductor 218.

Figure 9:
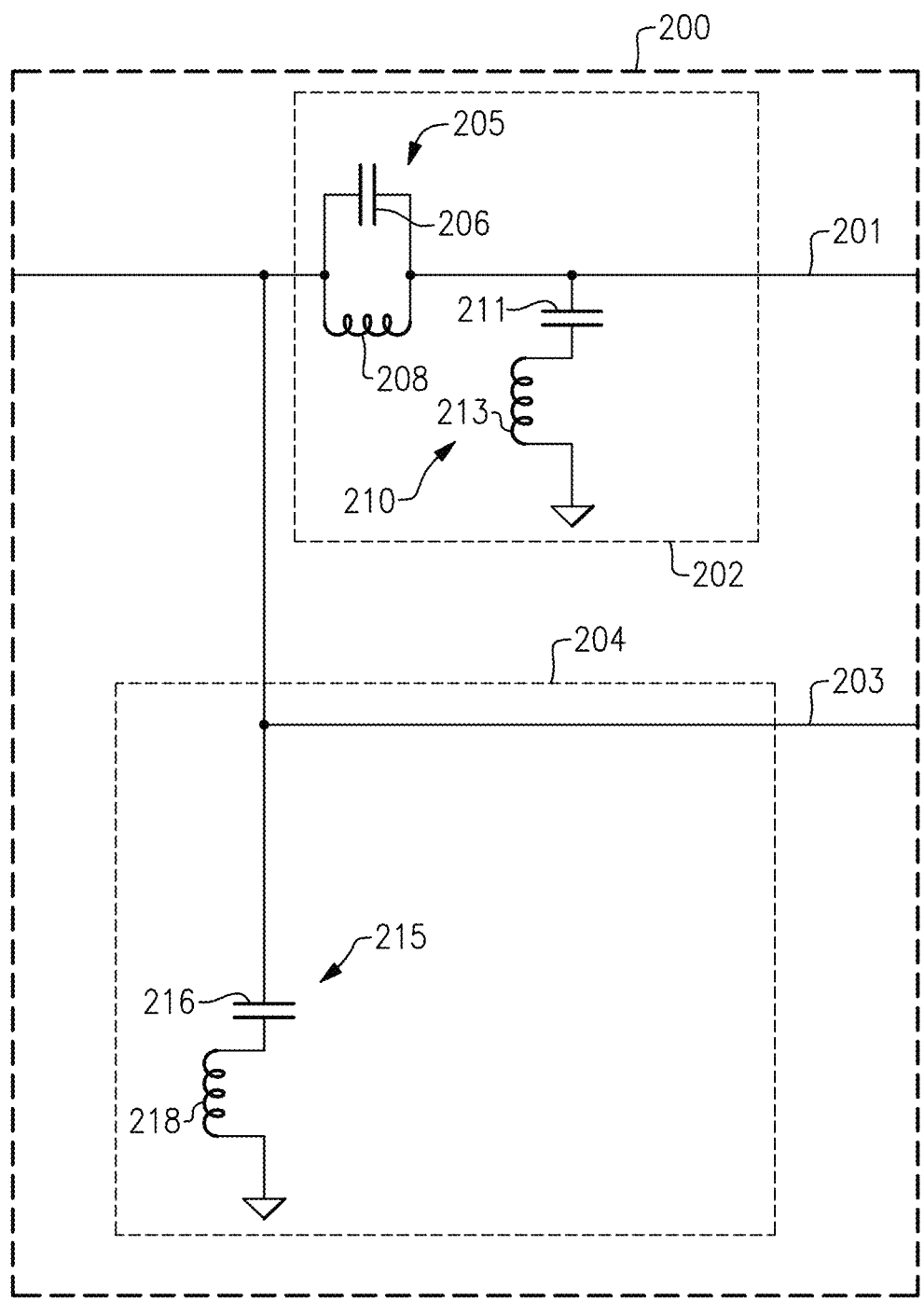
FIG. 9 is another circuit diagram illustrating an example harmonic resonant circuit of an output matching circuit in accordance with aspects of this disclosure.

FIG. 9 is another circuit diagram illustrating an example harmonic resonant circuit of an output matching circuit in accordance with aspects of this disclosure. In the embodiment of FIG. 9, the harmonic resonant circuit 200 includes a subset of the components of FIG. 8. The FIG. 9 embodiment may be able to sufficiently match the output impedance of the power amplifier block 32 as well as suppress harmonics in the first and second bands, while taking up a smaller footprint than in the FIG. 8 embodiment. In some embodiments, the output matching network 64 may be implemented on a printed circuit board using silicon on insulator technology. Reducing the number of components included in the harmonic resonant circuit 200 can therefore save space without sacrificing the desirable harmonic rejection in each of the first and second bands.

In particular, the harmonic resonant circuit 200 includes the first path 201, the second path 203, the first matching circuit 202, and the second matching circuit 204. The first matching circuit 202 can suppress harmonics of the first signal RFIN0 transmitted along the first path 201 and the second matching circuit 204 can suppress harmonics of the second signal RFIN1 transmitted along the second path 203.

The first matching circuit 202 includes a second-order harmonic resonant circuit 205 and a third-order harmonic resonant circuit 210 on the first output path 201. The a second-order harmonic resonant circuit 205 and a third-order harmonic resonant circuit 210 may function in a substantially similar fashion to the a second-order harmonic resonant circuit 205 and a third-order harmonic resonant circuit 210 described in connection with FIG. 8.

The second matching circuit 204 includes a third-order harmonic resonant circuit 215 on the second output path 203, which function in a substantially similar fashion to the third-order harmonic resonant circuit 215 described in connection with FIG. 8. In contrast to FIG. 8, the second matching circuit 204 does not include a second-order harmonic resonant circuit since the second-order harmonics may not be a significant source of loss in the second band. Additionally, the harmonic resonant circuit 200 may not include resistors on the first path or the second path 201 or 203 since the first matching circuit 202 and the second matching circuit 204 may be sufficient to match the output impedance of the power amplifier block 32.

In one embodiment, the components illustrated in FIG. 9 may have the following values to match a first band having a fundamental frequency of about 93 MHz and a second band having a fundamental frequency about 63 MHz. The capacitor 206 may have a value of about 13.3 pF, the inductor 208 may have a value of about 0.6 nH, the capacitor 211 may have a value of about 0.4 pF, the inductor 213 may have a value of about 10.5 nH, the capacitor 216 may have a value of about 1.1 pF, and the inductor 218 may have a value of about 4.7 nH. However, other values can be selected for the various components depending on the embodiment and the fundamental frequencies of the bands received by the power amplifier system 100.

Figure 10:
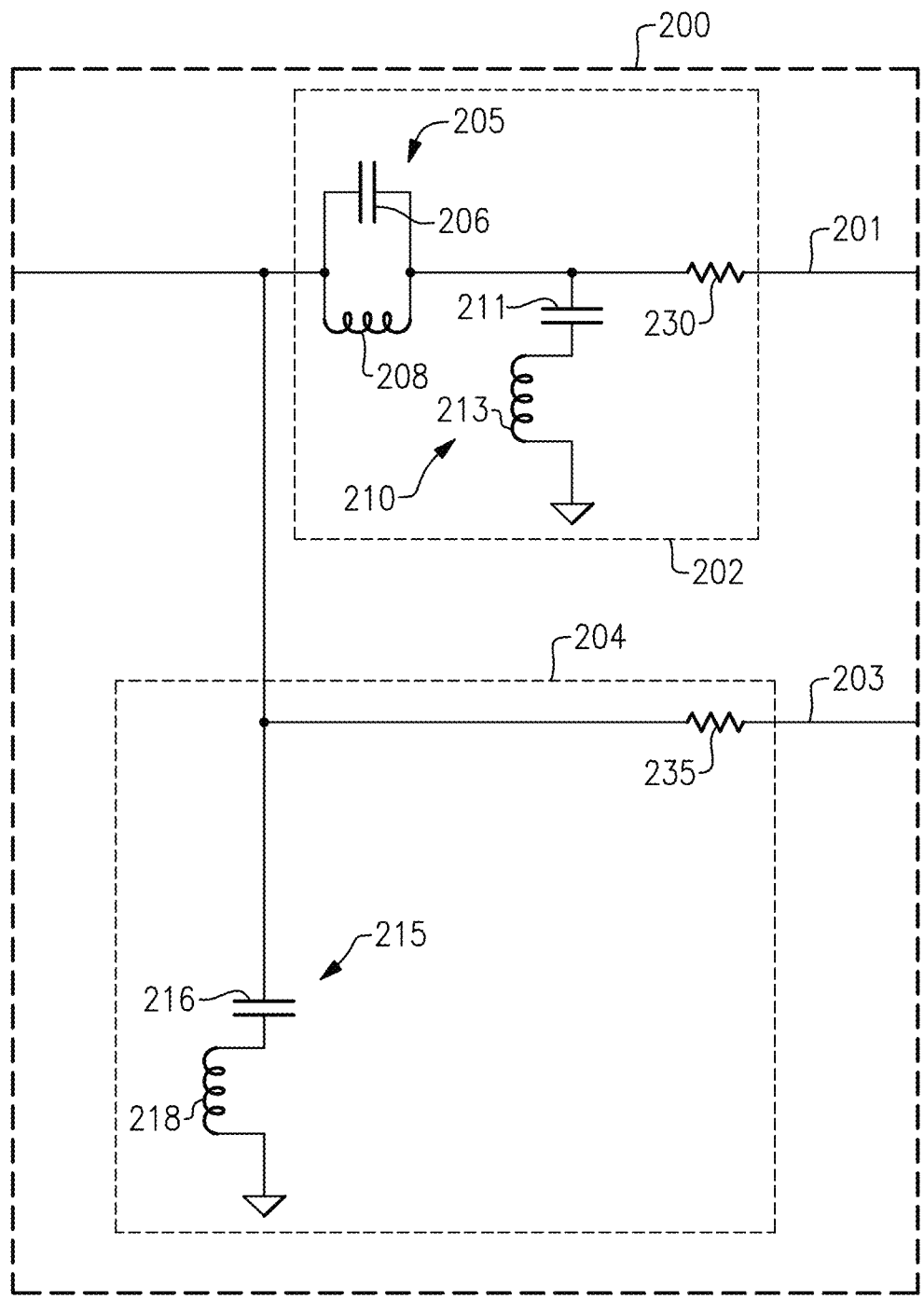
FIG. 10 is yet another circuit diagram illustrating an example harmonic resonant circuit of an output matching circuit in accordance with aspects of this disclosure.

FIG. 10 is yet another circuit diagram illustrating an example harmonic resonant circuit of an output matching circuit in accordance with aspects of this disclosure. In the embodiment of FIG. 10, the harmonic resonant circuit 200 includes the components illustrated in the harmonic resonant circuit 200 of FIG. 9 and also includes a first resistor 230 in the first output path 201 and a second resistor 235 in the second output path 203. The first and second resistors 230 may have values selected to match the impedance of the power amplifier block 32 in the first and second bands, respectively.

Figure 11:
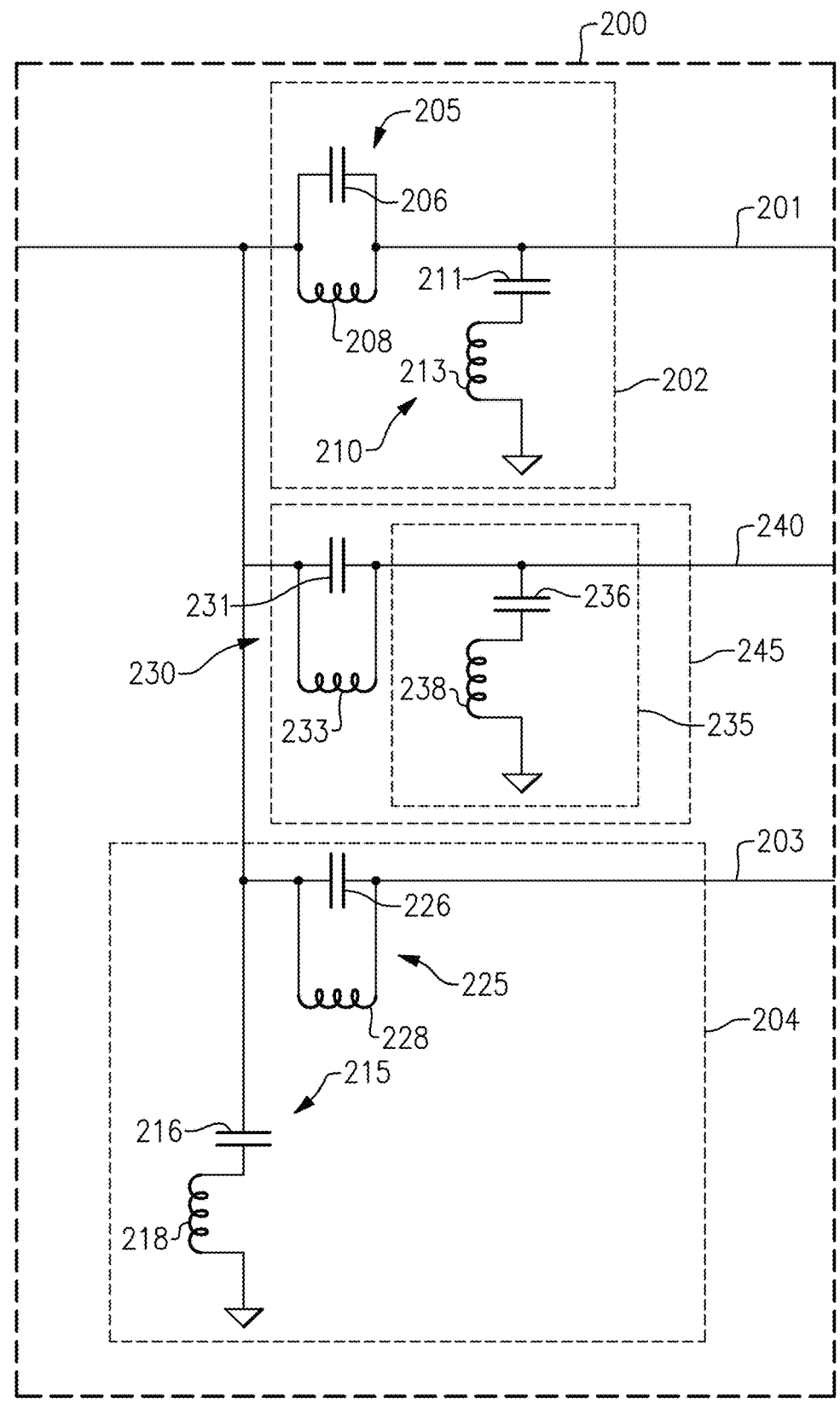
FIG. 11 is still yet another circuit diagram illustrating an example harmonic resonant circuit of an output matching circuit in accordance with aspects of this disclosure.

FIG. 11 is still yet another circuit diagram illustrating an example harmonic resonant circuit of an output matching circuit in accordance with aspects of this disclosure. In the embodiment of FIG. 11, the harmonic resonant circuit 200 includes the components illustrated in the harmonic resonant circuit 200 of FIG. 9 and also includes a third output path 240 and a third matching circuit 245. The third path 240 may be configured to receive a signal from the power amplifier block 32 in a third band, different from the first and second bands. The third matching circuit 245 can include a second-order harmonic resonant circuit 230 and an optional third-order harmonic resonant circuit 235 on the third output path 240.

The second-order harmonic resonant circuit 230 includes a capacitor 231 and an inductor 233 connected in parallel. The second-order harmonic resonant circuit 230 can reduce or eliminate second-order harmonic frequency signal components of the third signal by presenting an impedance to the second-order harmonic frequency of the third signal. The third-order harmonic resonant circuit 235 includes a capacitor 236 and an inductor 238 connected in series between the output of the transformer 64 and ground. The third-order harmonic resonant circuit 235 can reduce or eliminate third-order harmonic frequency signal components of the third signal by providing a low impedance path for third-order harmonic frequency signal components to ground.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a power amplifier configured to amplify a radio frequency input signal having a fundamental frequency, the power amplifier including an input configured to receive the radio frequency input signal and an output configured to generate an amplified radio frequency signal; and
an output matching circuit including an input configured to receive the amplified radio frequency signal, a first output, a second output, a first matching circuit electrically connected between the input of the output matching circuit and the first output, and a second matching circuit electrically connected between the input of the output matching circuit and the second output, the first matching circuit configured to suppress harmonics of the fundamental frequency when the radio frequency input signal is within a first band, and the second matching circuit configured to suppress harmonics of the fundamental frequency when the radio frequency input signal is within a second band different from the first band, the output matching circuit further including a first resistor electrically connected between the first matching circuit and the first output and configured to match an output impedance of the power amplifier when the radio frequency input signal is within the first band, and a second resistor electrically connected between the second matching circuit and the second output and configured to match the output impedance of the power amplifier when the radio frequency input signal is within the second band.

2. The power amplifier system of claim 1 wherein the first matching circuit includes a second-order harmonic resonant circuit configured to suppress second-order frequency signal components of the amplified radio frequency signal and a first third-order harmonic resonant circuit configured to suppress third-order frequency signal components of the amplified radio frequency signal, and the second matching circuit includes a second third-order harmonic resonant circuit configured to suppress third-order frequency signal components of the amplified radio frequency signal.

3. A power amplifier system comprising:
a power amplifier configured to amplify a radio frequency input signal having a fundamental frequency, the power amplifier including an input configured to receive the radio frequency input signal and an output configured to generate an amplified radio frequency signal;
an output matching circuit including an input configured to receive the amplified radio frequency signal, a first output, a second output, a first matching circuit electrically connected between the input of the output matching circuit and the first output, and a second matching circuit electrically connected between the input of the output matching circuit and the second output, the first matching circuit configured to suppress harmonics of the fundamental frequency when the radio frequency input signal is within a first band, and the second matching circuit configured to suppress harmonics of the fundamental frequency when the radio frequency input signal is within a second band different from the first band, the first matching circuit including a second-order harmonic resonant circuit configured to suppress second-order frequency signal components of the amplified radio frequency signal and a first third-order harmonic resonant circuit configured to suppress third-order frequency signal components of the amplified radio frequency signal, and the second matching circuit including a second third-order harmonic resonant circuit configured to suppress third-order frequency signal components of the amplified radio frequency signal, the second-order harmonic resonant circuit including a capacitor and an inductor connected in parallel, and each of the first and second third-order harmonic resonant circuits including a capacitor and an inductor connected in series to ground.

4. The power amplifier system of claim 1 wherein the output matching circuit further includes a balun electrically connected between the output of the power amplifier and each of the first matching circuit and the second matching circuit.

5. The power amplifier system of claim 1 wherein the output matching circuit further includes a third output and a third matching circuit electrically connected between the input of the output matching circuit and the third output, the third matching circuit configured to suppress harmonics of the fundamental frequency of the amplified radio frequency signal when the radio frequency input signal is within a third band different from the first and second bands.

6. A power amplifier system comprising:
a power amplifier configured to amplify a radio frequency input signal having a fundamental frequency, the power amplifier including an input configured to receive the radio frequency input signal and an output configured to generate an amplified radio frequency signal;
an output matching circuit including an input configured to receive the amplified radio frequency signal, a first output, a second output, a first matching circuit electrically connected between the input of the output matching circuit and the first output, and a second matching circuit electrically connected between the input of the output matching circuit and the second output, the first matching circuit configured to suppress harmonics of the fundamental frequency when the radio frequency input signal is within a first band, and the second matching circuit configured to suppress harmonics of the fundamental frequency when the radio frequency input signal is within a second band different from the first band; and
an input switch including a first input configured to receive a radio frequency input signal within the first band, a second input configured to receive a radio frequency input signal within the second band, and an output configured to selectively output one of the radio frequency input signals to the input of the power amplifier.

7. The power amplifier system of claim 1 wherein the first matching circuit includes a second-order harmonic resonant circuit configured to suppress second-order frequency signal components of the amplified radio frequency signal and a first third-order harmonic resonant circuit configured to suppress third-order frequency signal components of the amplified radio frequency signal, and the second matching circuit includes a second-order harmonic resonant circuit configured to suppress second-order frequency signal components of the amplified radio frequency signal and a second third-order harmonic resonant circuit configured to suppress third-order frequency signal components of the amplified radio frequency signal.

8. An output matching circuit for a power amplifier that amplifies a radio frequency signal having a fundamental frequency, the output matching circuit comprising:
an input configured to receive an amplified radio frequency signal from a power amplifier;
first and second outputs;
a first matching circuit electrically connected between the input and the first output, the first matching circuit configured to suppress harmonics of a fundamental frequency of the amplified radio frequency signal when the amplified radio frequency signal is within a first band, the first matching circuit including a second-order harmonic resonant circuit configured to suppress second-order frequency signal components of the amplified radio frequency signal and a first third-order harmonic resonant circuit configured to suppress third-order frequency signal components of the amplified radio frequency signal; and
a second matching circuit electrically connected between the input and the second output, the second matching circuit configured to suppress harmonics of the fundamental frequency of the amplified radio frequency signal when the amplified radio frequency signal is within a second band different from the first band, the second matching circuit including a second third-order harmonic resonant circuit configured to suppress third-order frequency signal components of the amplified radio frequency signal.

9. The output matching circuit of claim 8 wherein the second-order harmonic resonant circuit includes a capacitor and an inductor connected in parallel, and each of the first and second third-order harmonic resonant circuits includes a capacitor and an inductor connected in series to ground.

10. The output matching circuit of claim 8 wherein the output matching circuit further includes a balun electrically connected between the power amplifier and each of the first matching circuit and the second matching circuit.

11. The output matching circuit of claim 8 further comprising a third output and a third matching circuit electrically connected between the input and the third output, the third matching circuit configured to suppress harmonics of the fundamental frequency of the amplified radio frequency signal when the radio frequency input signal is within a third band different from the first and second bands.

12. The output matching circuit of claim 8 further comprising a first resistor electrically connected between the first matching circuit and the first output and configured to match an output impedance of the power amplifier when the radio frequency input signal is within the first band, and a second resistor electrically connected between the second matching circuit and the second output and configured to match the output impedance of the power amplifier when the radio frequency input signal is within the second band.

13. The output matching circuit of claim 8 wherein the first matching circuit includes a second-order harmonic resonant circuit configured to suppress second-order frequency signal components of the amplified radio frequency signal and a first third-order harmonic resonant circuit configured to suppress third-order frequency signal components of the amplified radio frequency signal, and the second matching circuit includes a second-order harmonic resonant circuit configured to suppress second-order frequency signal components of the amplified radio frequency signal and a second third-order harmonic resonant circuit configured to suppress third-order frequency signal components of the amplified radio frequency signal.

14. A mobile device comprising:
an antenna;
a power amplifier configured to amplify a radio frequency input signal having a fundamental frequency, the power amplifier including an input configured to receive the radio frequency input signal and an output configured to generate an amplified radio frequency signal for transmission via the antenna;
an output matching circuit including an input configured to receive the amplified radio frequency signal, a first output, a second output, a first matching circuit electrically connected between the input of the output matching circuit and the first output, and a second matching circuit electrically connected between the input of the output matching circuit and the second output, the first matching circuit configured to suppress harmonics of the fundamental frequency when the radio frequency input signal is within a first band, and the second matching circuit configured to suppress harmonics of the fundamental frequency when the radio frequency input signal is within a second band different from the first band, and
a third output and a third matching circuit electrically connected between the input of the output matching circuit and the third output, the third matching circuit configured to suppress harmonics of the fundamental frequency when the radio frequency input signal is within a third band different from the first and second bands.

15. The mobile device of claim 14 wherein the first matching circuit includes a second-order harmonic resonant circuit configured to suppress second-order frequency signal components of the amplified radio frequency signal and a first third-order harmonic resonant circuit configured to suppress third-order frequency signal components of the amplified radio frequency signal, and the second matching circuit includes a second third-order harmonic resonant circuit configured to suppress third-order frequency signal components of the amplified radio frequency signal.

16. The mobile device of claim 15 wherein the second-order harmonic resonant circuit includes a capacitor and an inductor connected in parallel, and each of the first and second third-order harmonic resonant circuits includes a capacitor and an inductor connected in series to ground.

17. The mobile device of claim 14 wherein the output matching circuit further includes a balun electrically connected between the power amplifier and each of the first matching circuit and the second matching circuit.

18. The mobile device of claim 14 further comprising an input switch including a first input configured to receive a radio frequency input signal within the first band, a second input configured to receive a radio frequency input signal within the second band, and an output configured to selectively output one of the radio frequency input signals to the input of the power amplifier.

19. The power amplifier system of claim 1 wherein the output matching circuit further includes a set of first band capacitors configured to match the output of the power amplifier over the bandwidth of the first band and a set of second band capacitors configured to match the output of the power amplifier over the bandwidth of the second band.

20. The power amplifier system of claim 19 wherein the output matching circuit further includes a plurality of switches configured to connect the sets of first and second band capacitors.

* * * * *